Nov. 9, 1954 G. W. DAVIS ET AL 2,694,040

METHOD OF SELECTIVELY PLATING p-TYPE MATERIAL OF A SEMICONDUCTOR CONTAINING A p-n JUNCTION

Filed Dec. 28, 1951

INVENTORS G. W. DAVIS
M. C. WALTZ
BY
R. J. Guenther
ATTORNEY 2,694,040
Patented Nov. 9, 1954

2,694,040

METHODS OF SELECTIVELY PLATING p-TYPE MATERIAL OF A SEMICONDUCTOR CONTAINING A p-n JUNCTION

Gustoff W. Davis, Madison, and Maynard C. Waltz, Maplewood, N. J., assignors to Bell Telephone Laboratories, Incorporated, New York, N. Y., a corporation of New York Application December 28, 1951, Serial No. 263,804

7 Claims. (Cl. 204—15)

Figure 1:
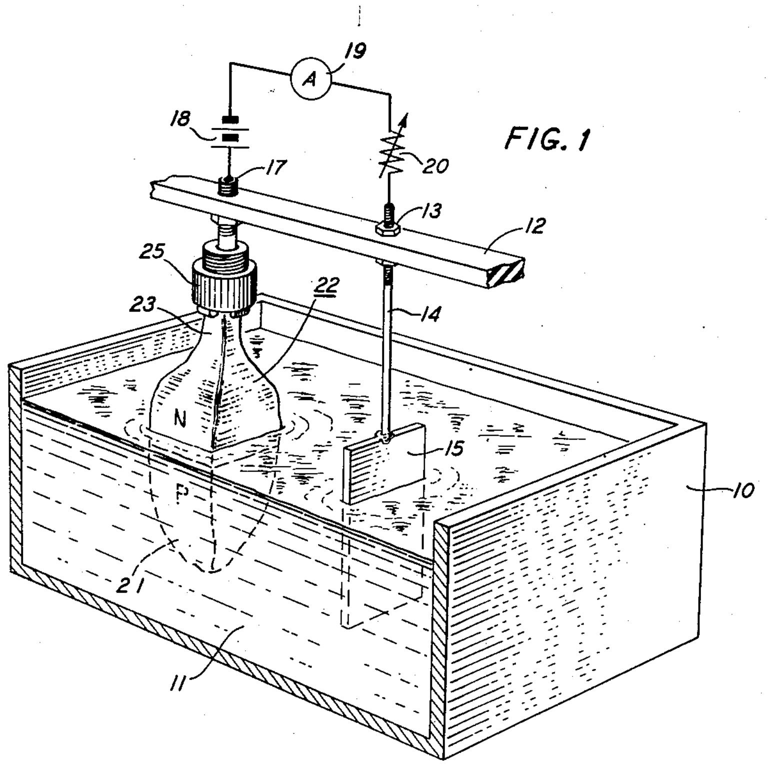

This invention relates to methods of processing semiconductor bodies and more particularly to selectively applying a metallic plating to p-type material in the vicinity of a p-n junction for purposes such as methods of locating and marking p-n junctions on semiconductor bodies.

An object of this invention is to simplify the locating and marking of p-n junctions.

In processing of semiconductor devices containing p-n junctions, it is important to accurately define the junction so that it may be properly oriented in the device. Heretofore the locating and marking of junctions has entailed a somewhat complex, time consuming, and expensive procedure. Junctions have been defined with the use of hot and cold probes connected in the proper manner to a galvanometer and by scanning with light. These techniques, however, have been difficult to employ where the junction has been other than a straight line at the body surface since they require an investigation of essentially the entire body surface. Junctions also have been defined by etching the semiconductor body as disclosed in the applications of Morgan Sparks Serial No. 168,183 filed June 15, 1950, now abandoned and Serial No. 239,609 filed July 31, 1951, now patent No. 2,656,496, October 20, 1953 and by applying dielectric particles to the body as disclosed in G. L. Pearson application Serial No. 241,217 filed August 10, 1951, now Patent No. 2,669,692, February 16, 1954.

In accordance with the present invention, p-n junctions in semi-conductor bodies are sharply defined by electroplating a rugged, adherent, yet readily removable coating on one side of the junction while the material on the other side of the junction remains free of any coating. One embodiment of this invention comprises plating a thin line of copper on the p side of the junction by immersing that portion of the semiconductor body including the junction in a copper sulphate ($CuSO_4$) solution and drawing a direct current through the body with the n-side poled positive relative to an electrode in the electrolyte.

Plating according to this invention results in the deposition of a sharp shelf of material on the p side of a p-n junction which tapers down in thickness rapidly with the spacing from the junction. The deposition can be accomplished by several methods provided the voltage drop across the junction is maintained at least as great as the polarographic potential of the metal in the plating solution. Thus, in one embodiment the junction can be defined by making a direct connection to both the n and p-type material, daubing or otherwise applying a plating solution over the region in which the junction is located, and drawing a reverse current across the junction. The reverse current across the junction, p-type material biased negative and n-type material biased positive, causes metal to be plated out of the solution on the p-type material in the immediate vicinity of the junction and oxygen to be evolved from the solution on the n side of the junction. This selective plating on the p side is caused by the field gradient across the junction, a sharp voltage drop occurring at that point relative to the total voltage drop over the entire length of the semiconductive body.

Another plating technique similar to that described above includes establishing connections from the energy source to the surface of the semiconductive body in regions spaced from and on opposite sides of the junction and completely immersing the section of the body containing the junction in a plating solution. Again current flowing from a positively biased n side to a negatively biased p side builds up a field across the junction and causes a plating of metal ions out of the solution and onto the p-type cathode.

Another plating arrangement which lends itself to mass production techniques and involves making a direct connection to the n side of the semiconductive body is disclosed as a preferred embodiment of this invention. Here the contact is biased positive relative to an electrode in the plating solution. In conventional electroplating processes the plating material is deposited on the negatively poled element. The process is unique in its utilization of a p-n junction to effectively obtain a double deposition out of the plating solution onto the cathode of p-type material in the vicinity of the junction formed by the voltage drop across the junction and onto the cathode in the solution, rather than the conventional transfer of ions from the anode to the plating solution and thence from the plating solution to the cathode. Plating as effected in this form of the present process has been termed "plating by induction" in that there is no direct connection from the energy source to the cathode formed by the p-type material other than that across the rectifying junction.

Figure 2:
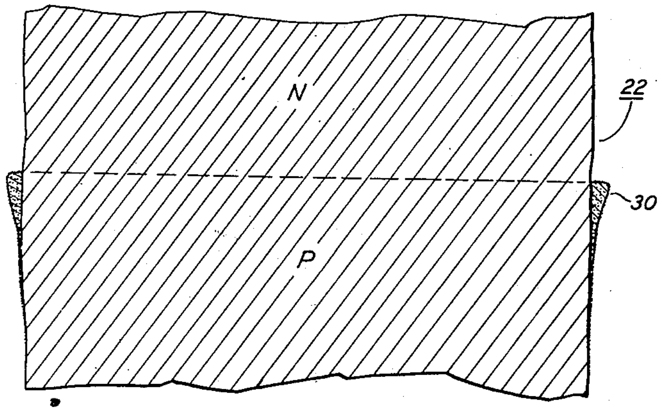

The invention may be more fully understood from the following detailed description when read in conjunction with the accompanying drawing in which:

Fig. 1 is a perspective view of one form of plating apparatus with portions cut away to more clearly illustrate the techniques of plating involved, and Fig. 2 is a sectioned elevation of the portion of a body which has been plated to define the junction.

The apparatus illustrated in Fig. 1 comprises a tank 10 which may be of material which is inert to the electrolyte 11 being employed or is coated on its internal surfaces with such a material. Positioned above the tank by suitable means (not disclosed) is an insulating support bar 12 carrying an electrode holder 13 which secures a rod 14 integral with an electrode 15 in a proper position to maintain the electrode immersed in the electrolyte. The bar 12 also supports one or more holders 17 for semiconductor devices to be processed. These holders may be of any convenient form such as the stationary clamp disclosed, or, if desired, a rack and pinion vertical traverse. Connected between the electrode holder 13 and the semiconductor holder 17 are a source of unidirectional current 18, an ammeter 19, and a variable limiting resistor 20 all of which in combination provide means for controlling the plating applied to the semiconductor.

While the plating technique under discussion here is applicable to any semiconductor body, it is disclosed in the drawing as applied to a single crystal rod of germanium which has been produced in accordance with the disclosure of the application of G. K. Teal Serial No. 168,184 filed June 15, 1950. This semiconductor body 22 includes in upper section 23 which is of n-type material having a portion of restricted cross section above an enlarged section, and a lower p-type region 21. In defining a junction in such a device, it is removed from the crystal growing apparatus and maintained in the chuck 25 in which it was grown. The surface is then superficially examined, as with hot and cold probes, along the axis of the rod to ascertain the region in which the n-p junction exists. The peripheral surface of the rod in which the probe investigation has indicated the junction lies is then sand blasted with a 280 Carborundum grit to clean the surface and facilitate the subsequent plating operation. The chuck 25 is then secured in the work holder 17 so that the rod including that portion containing the junction is immersed in electrolyte 11.

A suitable junction defining coating can be applied to a germanium body containing a p-n junction and having a conductivity on the p side of about 10 ohm$^{-1}$ cm.$^{-1}$ and on the n side of about 5 ohm$^{-1}$ cm.$^{-1}$ in a copper sulphate solution made up of 27 ounces of $CuSO_4 \cdot 5H_2O$ and 6.5 ounces of concentrated sulphuric acid ($H_2SO_4$ specific gravity) per gallon of water. This copper plating can be applied by passing 100 milliamperes for about 2 minutes from the semiconductive rod through the electrolyte to the electrode.

A current of this magnitude produces a voltage drop across the junction greater than the polarographic potential of copper in copper sulphate, about 0.5 volt. This technique results in a fine copper line 30, as seen in Fig. 2, around the periphery of the rod which is easily visible to define the junction by its upper limit. The field gradient in the region of the junction falls off rapidly with the spacing from the junction and since the amount of copper deposited corresponds to that field the visible deposition exists only in a narrow band in the immediate vicinity of the junction.

This plating technique of defining p-n junctions can readily be practiced with other electrolytes and electrodes to deposit coatings of other materials. Copper has been disclosed as one advantageous coating material because it produces a sharp color contrast with the silver-gray of the germanium, is inexpensive, is easily handled, and is readily available. It is to be understood that other metals can be electroplated from acid or base plating baths onto semiconductive bodies to define p-n junctions therein. For example, a defining line can be produced by silver deposited from silver nitrate, a nickel line can be plated from nickel sulphate, or gold can be deposited from a gold cyanide solution comprising a mixture of sodium gold cyanide, sodium cyanide and water.

Where the junction defining material is to be removed by a later step in the processing of the semiconductor bodies, this may be done with an acid etch. For example, a copper plated layer can conveniently be removed by etching the entire semiconductive body in an etchant such as that disclosed in R. D. Heidenrick application Serial No. 164,303 filed May 25, 1950, now Patent No. 2,619,414, November 25, 1952, comprising 15 parts by weight acetic acid, 25 parts by weight of nitric acid, 15 parts by weight of 48 per cent hydrofluoric acid, and 1 part by weight of liquid bromine. Where the body has been supplied with electrodes prior to the etching step, it has been found convenient to mask the region of contact between the electrodes and the body with polystyrene. Bodies which have been so masked in most cases are satisfactorily cleaned since the amount of copper deposited any substantial distance from the junction can be neglected.

While germanium has been employed as a material illustrative of the type to which the methods of this invention are applicable it is to be understood that these methods can be applied to silicon and other semiconductive materials containing p-n junctions.

What is claimed is:

1. The method of defining a p-n junction in a semiconductive body by selectively plating metal on the p-type material which comprises immersing the portion of the body containing the junction in an electroplating bath, connecting the positive terminal of a source of current to the n-type section of the body, connecting the negative terminal of the source of current to the p-type section of the body to establish a potential difference across the p-n junction which is at least as great as the polarographic potential of the metal in the plating bath, thereby passing current around the junction between the n- and p-type sections of the body by electrolytic conduction through the plating bath, and continuing the current flow for sufficient time to form a defining zone of plated metal on the p-type material adjacent the junction.

2. The method of defining a p-n junction in a semiconductive body by selectively plating metal on the p-type material which comprises immersing the portion of said body containing said junction in an electroplating bath, connecting the positive terminal of a source of current to the n-type section of the body, connecting the negative terminal of the source of current to an electrode immersed in the plating bath to establish a potential difference across the p-n junction in the body which is at least as great as the polarographic potential of the metal in the plating bath, thereby passing current by electrolytic conduction through the plating bath around the junction between the n- and p-type sections of the body, and continuing the current flow for sufficient time to form a defining zone of plated metal on the p-type material adjacent the junction.

3. The method of defining a p-n junction in a semiconductive body by selectively plating copper on the p-type material which comprises immersing the region containing the p-n junction in an electrolyte of copper sulphate connecting the positive terminal of a source of current to the n-type section of the body, connecting the negative terminal of the source of current to an electrode immersed in the electrolyte to establish a potential difference across the p-n junction in the body which is at least as great as the polarographic potential of the metal in the electrolyte, thereby passing current by electrolytic conduction through the electrolyte around the junction between the n- and p-type sections of the body, and continuing the current flow for sufficient time to form a defining zone of copper on the p-type material adjacent the junction.

4. The method in according with claim 3 wherein the semiconductive body is of germanium.

5. The method in accordance with claim 3 wherein the semiconductive body is of silicon.

6. The method of selectively plating a metal on the p-type semiconductive material in the vicinity of an n-p junction which comprises making an electrically positive connection to the n-type material, immersing at least that portion of the semiconductor containing the junction in an electrolyte containing a metallic radical, making an electrically negative connection to the p-type material to establish a potential difference between the n- and p-type material across the junction which is at least as great as the polarographic potential of the metallic radical in the electrolyte, thereby passing current by electrolytic conduction through the electrolyte around the n-p junction, and continuing the current flow for sufficient time to form a zone of plated metal on the p-type material adjacent the junction.

7. The method of selectively plating a metal on the p-type semiconductive material in the vicinity of an n-p junction which comprises making an electrically positive connection to the n-type material in a region spaced from the junction, immersing the p-type material and that portion of the n-type material adjacent the junction in an electrolyte containing a metallic radical, positioning a portion of the p-type material in proximity to an electrode in said electrolyte, making an electrically negative connection to the electrode to establish a potential difference across the p-n junction which is as great as the polarographic potential of the metallic radical in the electrolyte, thereby passing a unidirectional current around the junction between the n- and p-type sections of the body and through the electrolyte, and continuing the current flow for sufficient time to form a zone of plated metal on the p-type material adjacent the junction.

References Cited in the file of this patent

UNITED STATES PATENTS

| Number | Name | Date |
|---|---|---|
| 1,847,653 | Jones et al. | Mar. 1, 1932 |
| 2,443,543 | Ohl | June 15, 1948 |